(12) United States Patent
Koschinsky et al.

(10) Patent No.: US 7,063,091 B2
(45) Date of Patent: Jun. 20, 2006

(54) METHOD FOR CLEANING THE SURFACE OF A SUBSTRATE

(75) Inventors: Frank Koschinsky, Radebeul (DE); Volker Kahlert, Dresden (DE); Peter Huebler, Coswig (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/072,139

(22) Filed: Mar. 4, 2005

(65) Prior Publication Data

US 2005/0230344 A1 Oct. 20, 2005

(30) Foreign Application Priority Data

Mar. 31, 2004 (DE) ................. 10 2004 015 865

(51) Int. Cl.
*H01L 21/302* (2006.01)
*B08B 6/00* (2006.01)

(52) U.S. Cl. ................ 134/1.2; 134/1.3; 216/62; 216/78; 438/705; 438/714; 438/715; 438/734

(58) Field of Classification Search .............. 134/1.2, 134/1.3; 216/62, 78; 438/705, 714, 715, 438/734
See application file for complete search history.

(56) References Cited

U.S. PATENT DOCUMENTS

| 5,432,073 A | 7/1995 | Wu et al. ............... 437/195 |
| 6,107,182 A | 8/2000 | Asahina et al. ............ 438/618 |
| 6,110,828 A * | 8/2000 | Guo et al. ............... 438/688 |
| 6,613,660 B1 * | 9/2003 | Kahlert et al. ............ 438/597 |
| 6,764,940 B1 * | 7/2004 | Rozbicki et al. .......... 438/627 |
| 2003/0134504 A1* | 7/2003 | Denning et al. ........... 438/637 |
| 2004/0131878 A1* | 7/2004 | Seet et al. ............... 428/641 |
| 2005/0054202 A1* | 3/2005 | Pan et al. ............... 438/694 |

FOREIGN PATENT DOCUMENTS

| EP | 1 081 751 A2 | 3/2001 |
| JP | 01-258444 | * 10/1989 |

\* cited by examiner

*Primary Examiner*—George A. Goudreau
(74) *Attorney, Agent, or Firm*—Williams, Morgan & Amerson

(57) ABSTRACT

A cleaning process for cleaning the surface of a substrate is disclosed, wherein the surface comprises portions of a dielectric material and portions of a conductive material. According to the method disclosed, the temperature at the surface of the substrate is kept below a predefined value during the actual cleaning step in a reactive and/or inert plasma ambient, such as an argon gas ambient, wherein the predefined value corresponds to the surface temperature at which agglomeration of the conductive material occurs.

34 Claims, 6 Drawing Sheets

METHOD FOR CLEANING THE SURFACE OF A SUBSTRATE

BACKGROUND OF THE INVENTION

1. Field of the Invention

The present invention relates to the field of fabrication of integrated circuits, and, more particularly, to the cleaning of substrates on which integrated circuits are formed at the manufacture of metallization layers according to the so-called damascene technique.

2. Description of the Related Art

A typical process in the manufacturing of integrated circuits is the formation of conductive vias for wiring, i.e., electrically connecting individual components of the integrated circuit. A widely used process for surface wiring the individual components of an integrated circuit, also referred to as "metallization," is the so-called damascene process in which trenches are formed in an insulating layer and subsequently filled with a conductive material to form the conductive lines and vias. Currently, most of the silicon-based semiconductor chips comprise a metallization layer including silicon dioxide as a dielectric material and aluminum as the conductive material due to the aluminum's excellent adhesion to the surrounding silicon dioxide without any tendency to diffuse into the silicon dioxide.

In view of the increasing demand for high performance semiconductor chips over the past several years, efforts have been made to improve the electrical conductivity in metal connections electrically connecting the various individual components. In particular, copper has been proven to be a promising candidate for replacing the aluminum due to its lower specific resistivity, which is about one order of magnitude smaller than that of aluminum. Moreover, contrary to aluminum, copper does not show eutectic reactions and thermally-induced electromigration when used in very large scale integration ("VLSI") and ultra-large scale integration ("ULSI") semiconductor chips. Additionally, copper is capable of being deposited at low temperatures in openings having high aspect ratios, thereby yielding a good step coverage. The use of electrochemical deposition techniques for copper deposition is especially appealing due to low cost, high throughput, high quality of the deposited copper film, and excellent via/trench filling capabilities.

In order to provide a highly reliable integrated circuit, the metal of the interconnecting lines and vias has to sufficiently adhere to the surrounding dielectric material, and diffusion of the metal atoms into the dielectric material must be reduced as much as possible. Thus, in many cases, the metal may not be directly deposited onto the dielectric material, but a barrier layer has to be deposited on the surface of the dielectric layer prior to the deposition of the metal. For example, copper readily diffuses into silicon dioxide and does not adhere to silicon dioxide very well. Accordingly, a thin barrier layer, for instance comprising tantalum, is deposited to provide sufficient adhesion of the copper and to prevent diffusion of the copper into the silicon dioxide.

A typical prior art metallization process will be described in the following with reference to FIGS. 1a–1c. In FIG. 1a, a schematic cross-sectional view is shown of a semiconductor structure 100 including a substrate 101 having formed thereon a plurality of circuit elements that are for convenience not depicted. A first insulating layer 102 is formed over the substrate 101 and comprises a metal line 104 with a barrier layer 103 disposed between the insulating layer 102 and the metal line 104. The insulating layer 102 may, for example, be comprised of silicon dioxide, silicon nitride and the like. The metal line 104 may be a copper line and the barrier layer may comprise tantalum, tantalum nitride and the like. A second insulating layer 105 comprised of, for instance, silicon dioxide or silicon nitride, and a resist layer 106 are formed over the substrate 101, wherein an opening, in the present example a via 109, is formed in the insulating layer 105 and the resist layer 106. The semiconductor structure 100 is meant to represent a damascene structure in which an electrical connection is to be established between a first metallization layer, defined by the insulating layer 102 and the metal line 104, and a second metallization layer to be formed over the insulating layer 105, wherein the via 109 that is to be filled with copper provides this electrical connection.

A typical process flow for forming the semiconductor structure 100 may include the following steps. After formation of the first metallization layer, i.e., the insulating layer 102 and the metal line 104, the substrate 101 is planarized by chemical mechanical polishing and insulating material is deposited by any appropriate deposition method, such as chemical vapor deposition, to form the insulating layer 105. For the sake of simplicity, the deposition of any anti-reflective coating that may be necessary for further processing is not depicted. Subsequently, the photoresist layer 106 is coated on the insulating layer 105 and is patterned according to well known photolithography and etch techniques to form an opening 107 in the resist layer 106. Next, an anisotropic etch step, as indicated by arrows 108, is carried out to form the via 109 above the metal line 104.

FIG. 1b shows the semiconductor structure 100 with the resist layer 106 removed and with a barrier layer 110, for example comprised of tantalum or tantalum nitride, formed in the via 109 and on a surface 112 of the insulating layer 105. A seed layer 111, comprised of copper, is formed on the barrier layer 110.

Typically, after removing the resist layer 106, a cleaning process is preformed to remove any residuals and contaminants within the via 109 and the surface 112, which may otherwise compromise the further process step required for depositing the bulk copper and decrease the quality of the electrical connection to be formed in the via 109. Cleaning the portion of the metal line 104 exposed by the via 109 typically includes a first step, also referred to as out-gassing or degassing, where the semiconductor structure 100 is inserted in a degas chamber. During out-gassing, the temperature of the substrate is raised to promote the removal of contaminants from the surface 112 and the via 109. Subsequently, a so-called pre-clean step is carried out by introducing argon gas into the process chamber and applying a high frequency electric field to establish a plasma ambient for further removal of the contaminants. After cleaning the metal line 104 and the via 109, the barrier layer 110 is deposited by any appropriate deposition method, such as sputter deposition, using an appropriate sputter target and plasma ambient to provide the desired material composition of the barrier layer 110. Subsequently, the seed layer 111 may also be formed by sputter-depositing, for example, copper.

FIG. 1c schematically shows the semiconductor structure 100 with copper 113 filled into the via 109 to provide the electrical connection to the underlying metal line 104. Typically, the copper 113 is deposited by electroplating, wherein the barrier layer 110 and the copper seed layer 111 (see FIG. 1b) act as a current distribution layer connecting the substrate 101 with an external plating electrode. After depositing copper in an amount that is sufficient to reliably fill the via 109, the semiconductor structure 100 may be annealed to improve the crystallinity of the copper 113. Thereafter, the excess copper 113 may be removed by chemical mechanical polishing (CMP), wherein, at the same time, the barrier layer 110 and the copper seed layer 111 outside the via 109 are also removed and the surface 112 of the insulating layer 105 is planarized.

It turns out, however, that voids 114 may be frequently observed in the via 109, in particular, in the vicinity of the bottom of the via 109 and the bottom portion of sidewalls 115. As these voids 114 not only compromise the mechanical stability of the copper plug 113 but also significantly reduce the electrical characteristics of the copper plug 113, the reliability of the completed semiconductor structure 100 is significantly reduced, as already the failure of a single electrical connection may result in a failure of the entire integrated circuit.

In view of the above-described problems, it is, therefore, highly desirable to establish a process sequence that allows reduction of or even completely avoids the formation of voids at the bottom region of conductive vias.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one embodiment of the present invention, this is achieved by providing an improved method of cleaning the surface of a substrate, with said surface comprising portions of a dielectric material and portions of a conductive material. In particular, the method of the present invention comprises degassing the substrate in a process chamber to promote out-gassing of contaminants and pre-cleaning the surface of the substrate by introducing an inert gas, such as argon gas, and/or a reactive gas into the chamber. Additionally, the method comprises keeping the surface temperature of the substrate below a predefined first temperature $T_a$ to inhibit agglomeration of the conductive material.

According to another embodiment of the present invention, a method for cleaning the surface of a substrate is provided, wherein the surface comprises portions of a dielectric material and portions of a conductive material, wherein the method comprises a first step of degassing the substrate in a process chamber to promote out-gassing of contaminants and a second step of pre-cleaning the surface of the substrate by introducing an inert gas, such as argon gas, and/or a reactive gas into the chamber. Additionally, the method comprises keeping the surface temperature of the substrate prior to the pre-cleaning step below a second predefined temperature, lower than said first temperature $T_a$, so that, after completion of the cleaning process, the final surface temperature $T_f$ of the substrate does not exceed said predefined temperature $T_a$.

According to still another illustrative embodiment of the present invention, a method for cleaning the surface of a substrate is provided, wherein the surface temperature of the substrate prior to the pre-cleaning step is maintained below the second predefined temperature by means of a cooling step for cooling the substrate after said degassing step and prior to said pre-cleaning step.

According to a further embodiment of the present invention, the cooling step comprises interrupting the cleaning process after completion of the degassing step for a period of time and allowing the substrate to dissipate heat by at least one of terminal conduction, radiation and convection for a predefined time period.

According to a further embodiment of the present invention, the cleaning process comprises several degassing steps and pre-cleaning steps and the cleaning process is interrupted after each degassing step and prior to pre-cleaning step for a period of time.

According to a further illustrative embodiment of the present invention, the surface temperature of the substrate is maintained below said first predefined temperature $T_a$ by cooling the substrate during pre-cleaning of said substrate surface.

In a further embodiment, the substrate is cooled by controlling the flow of a coolant to a support stage supporting the substrate.

BRIEF DESCRIPTION OF THE DRAWINGS

The invention may be understood by reference to the following description taken in conjunction with the accompanying drawings, in which like reference numerals identify like elements, and in which.

Figure 1A:
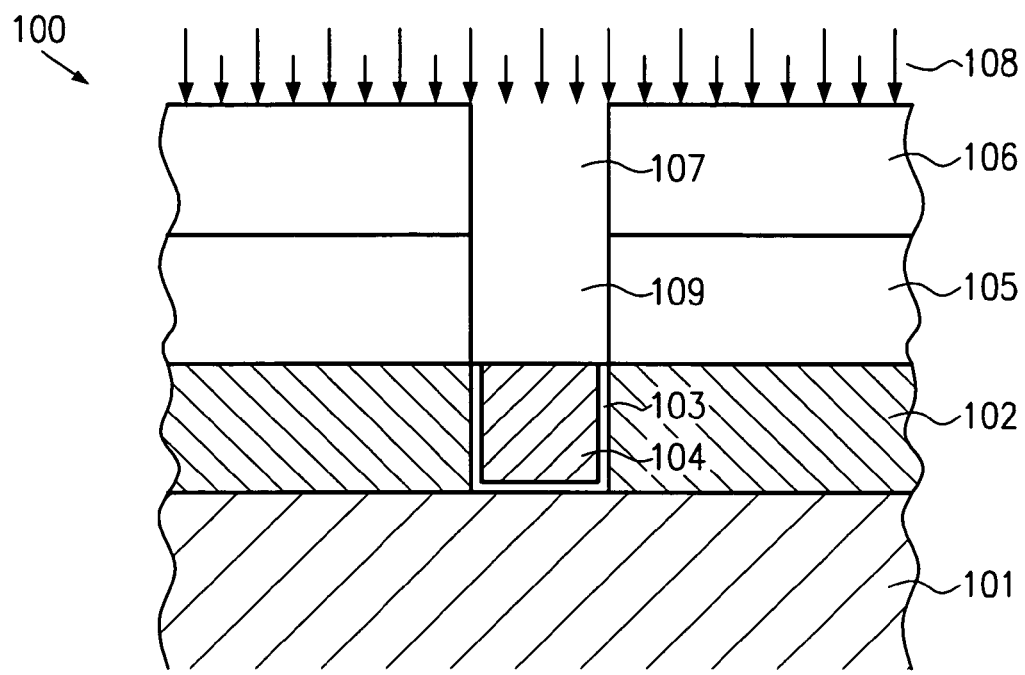
FIGS. 1a–1c represent a typical process sequence of a prior art metallization process to explain the problems involved.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously noted, the present invention is directed at a process sequence allowing the avoidance or at least a significant reduction of the formation of voids in a conductive via. It is believed that void generation is caused or at least promoted by the mechanism as illustrated in FIGS. 1d and 1e.

Figure 1B:
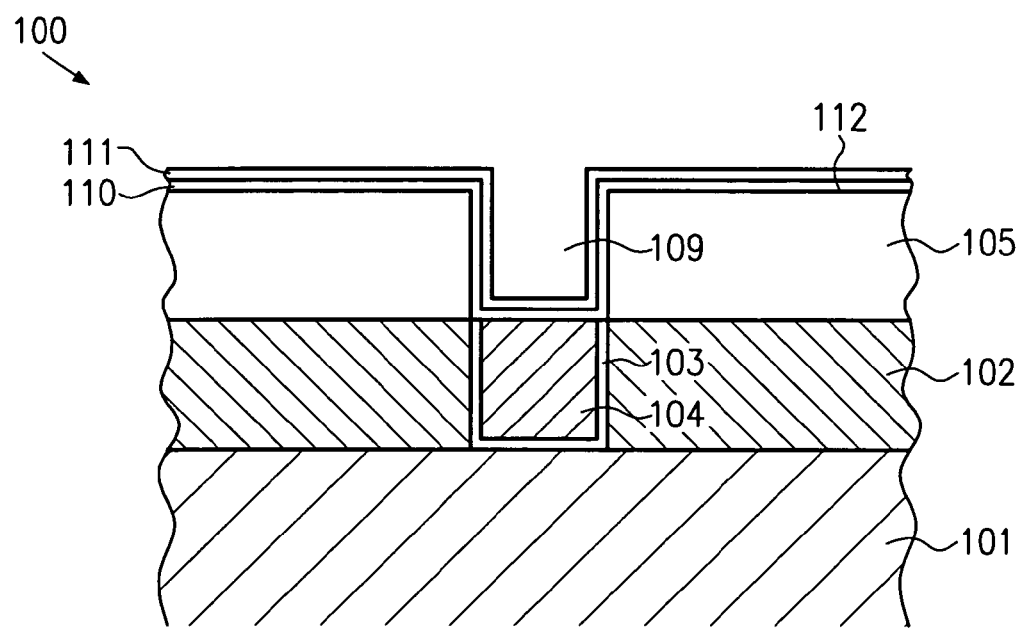
Figure 1C:
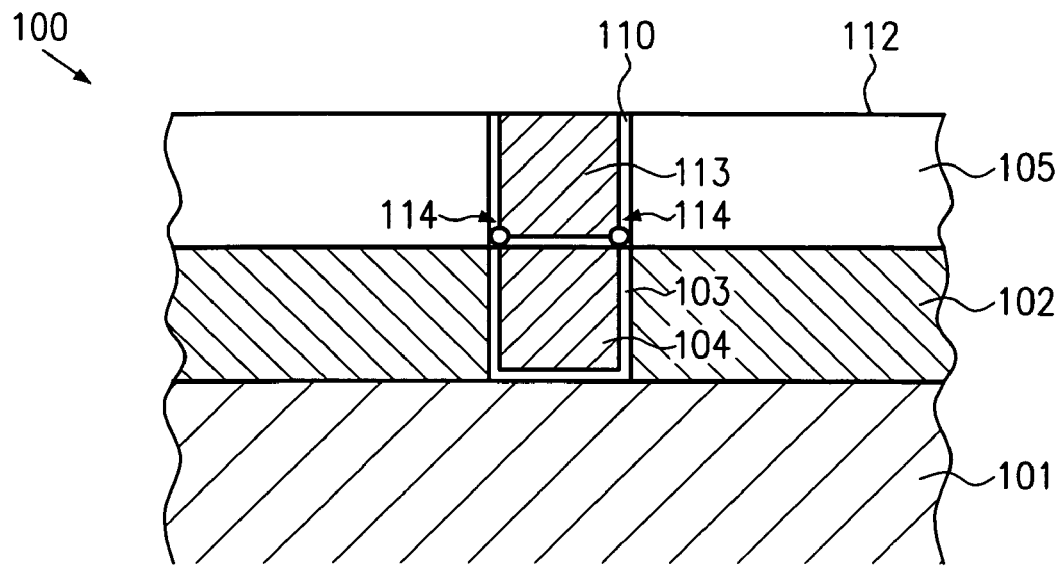
Figure 1D:
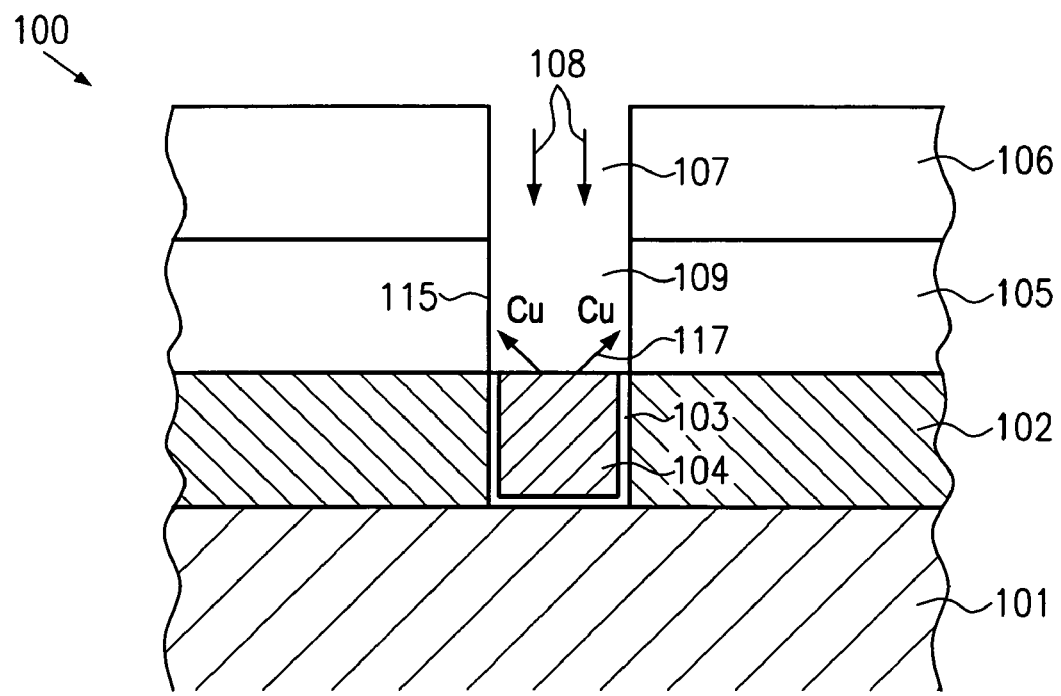
FIGS. 1d–1e show the semiconductor structure of FIG. 1a, thereby depicting a mechanism of void generation in a copper-filled via.

FIG. 1d schematically shows the semiconductor structure 100 as already illustrated in FIG. 1a and so a description thereof will be omitted. During the etching of the via 109, as indicated by 108, a certain amount of over-etch time has to be applied and this may lead to sputtering copper atoms off the metal line 104, as indicated by reference sign 117. The released copper atoms may then, at least partially, deposit on the lower sidewall portions 115 of the via 109.

As already explained with reference to FIGS. 1a and 1b, the semiconductor structure 100 is subjected to a cleaning process prior to the formation of the barrier layer 110 and the seed layer 111 (FIG. 1b) and the temperature raise during the out-gassing step may promote the deposition of cluster-like copper portion on the lower sidewall portions 115.

Figure 1E:
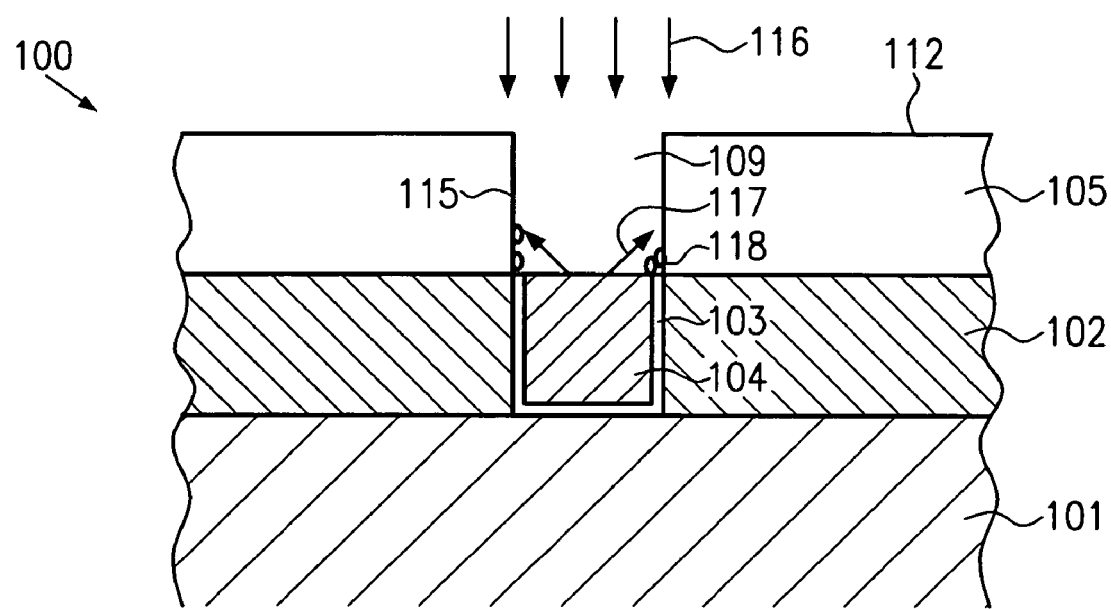

FIG. 1e schematically shows the semiconductor structure 100 during the pre-clean process, indicated as 116, following the out-gassing step, in which a plasma ambient is generated to further remove residuals and contaminants from the surface 112 and the via 109. As in the case of etching 108 the via 109 described above, copper atoms may also be sputtered off the metal line 104 by incoming ions of the plasma ambient during this pre-cleaning 116 and may also deposit on the lower sidewall portions 115 of the via 109. Moreover, the heat created during the preceding out-gassing step and during the pre-clean step 116 by the oncoming particles and by the plasma generating assembly results in a certain degree of agglomeration of the released copper atoms, as is indicated by 118. The agglomerations 118 may even be further increased upon sputter-depositing the barrier layer 110 and the seed layer 111 (FIG. 1b). These agglomerations 118 then may lead to the formation of the voids 114 during electroplating and annealing of the copper 113.

According to the inventors' finding, the formation of the voids 114 may significantly be influenced by the amount of heat supplied to, and thus the temperature of, the substrate 101 during the above-described process sequence.

Figure 2:
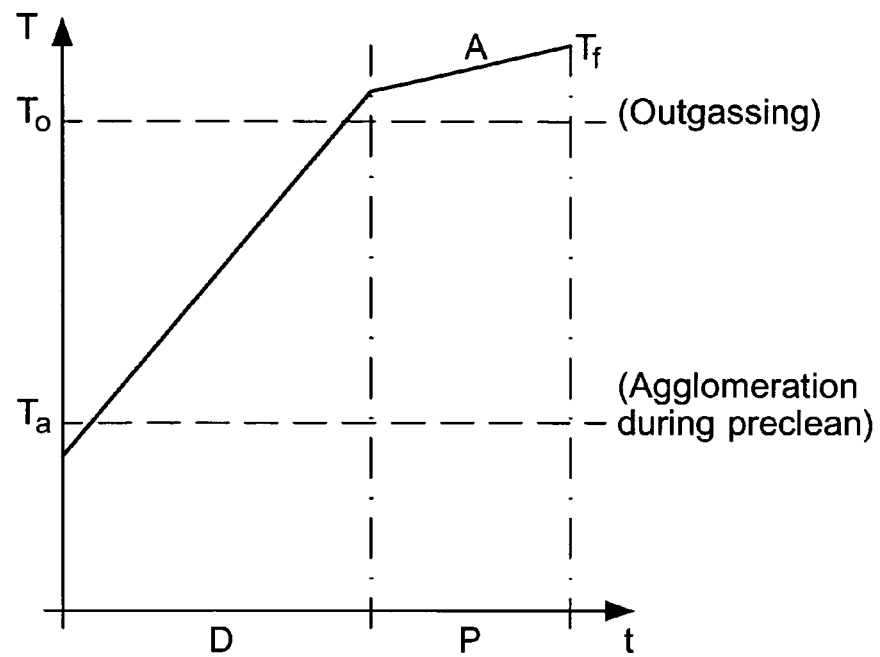
FIG. 2 schematically illustrates the surface temperature of a substrate versus the time of the process in a typical prior art cleaning process used for manufacturing the semiconductor structure of FIG. 1c.

FIG. 2 schematically illustrates a prior art cleaning process, for example as described with reference to FIGS. 1a–1e, depicting the surface temperature of the substrate versus the time of the process. The prior art cleaning process depicted in FIG. 2 comprises a degassing step indicated by D and a cleaning step (also referred to as pre-cleaning) indicated by P. Usually, the pre-cleaning step P is carried out immediately after completion of the degassing step D. As a result, the progression of the surface temperature of the substrate steadily increases with time and can be substantially represented by the curve A shown in FIG. 2. The slope and the exact shape of the progression of the temperature versus time curve is determined by the substrate's capability to dissipate heat to the environment by, for example, heat conductivity to the support stage, radiation loss and convection. In FIG. 2, $T_a$ represents the surface temperature of the substrate at which agglomeration occurs, $T_o$ represents a surface temperature of the substrate at which out-gassing or degassing of the surface contaminants occurs and $T_f$ represents the final temperature at the surface of the substrate after completion of the cleaning process. The magnitude of $T_f$ depends on cleaning parameters such as magnitude of the applied bias power and duration of the cleaning process as well as the substrate's capability of dissipating heat.

As apparent from FIG. 2, the surface temperature of the substrate has a value during the cleaning process that is significantly higher than the value $T_a$, owing to the high out-gassing temperature $T_o$ of the preceding out-gassing process and therefore agglomeration may occur.

According to the present invention, agglomeration of the back sputtered metal in the lower portion of the via sidewalls can effectively be reduced, if not even completely avoided, by maintaining the surface temperature of the substrate during the cleaning process below the critical temperature $T_a$ at which agglomeration occurs. In particular, according to the present invention, it is possible to modify the sequence of the process sequence including degassing and cleaning processes to maintain the surface temperature of the substrate low enough during the actual cleaning phase to avoid agglomeration (below the critical temperature $T_a$), while maintaining a sufficiently high temperature during the out-gassing step so that out-gassing of the contaminants efficiently occurs. For a typical damascene process, the critical temperature may be less than 100° C.

Figure 3:
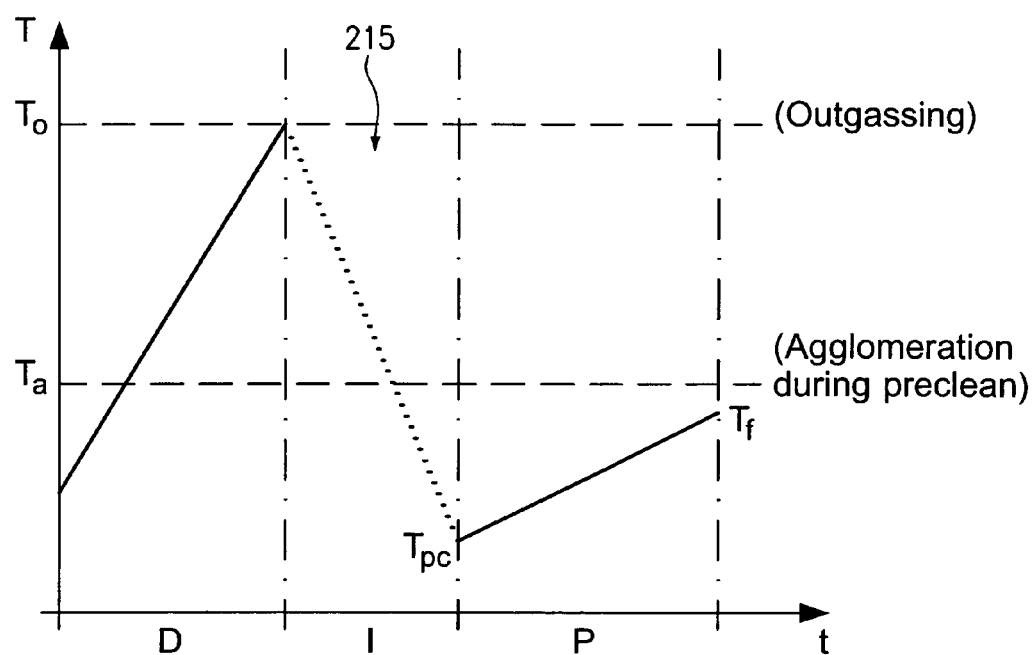
FIG. 3 schematically represents the surface temperature of the substrate versus the time of the process in the cleaning process according to one embodiment of the present invention.

FIG. 3 schematically shows the progression of temperature versus the process time for a process sequence including a degas process and a cleaning process in accordance with one embodiment of the present invention. First, as previously described, a degassing step indicated by D is performed, and thereafter a sequence interruption over a pre-defined time period is carried out in which substantially no cleaning activity is performed on the surface to allow the substrate surface to reduce the temperature by heat conductivity, radiation loss and convection. This sequence interruption is indicated by the portion of the line indicated with numeral 215, and the reference letter "I". The interruption time period may last from about 10 seconds to about 200 seconds, depending on the time required for the subsequent cleaning step indicated by P. After the time period for the sequence interruption has lapsed, the cleaning process is resumed by introducing, according to one particular embodiment, argon gas into the process chamber and applying a high frequency electric field to the reactive gases to establish a plasma for further removing contaminants from both the dielectric portions and the conductive portion of the underlying metal layer. In other embodiments, other inert and/or reactive gases, such as helium or helium/hydrogen may be used. As a result, the start temperature $T_{pc}$ for the pre-cleaning process P is significantly lower than it would be without the sequence interruption 215. Accordingly, after completion of the cleaning process P, the final surface temperature $T_f$ does not exceed the critical temperature $T_a$ so that substantially no agglomeration of the metal in the lower portion of the via sidewalls occurs.

Accordingly, the via 109 as depicted in FIGS. 1a–1e may then be formed substantially without any voids.

As is apparent from FIG. 4, with the cleaning sequence depicted therein, the surface temperature of a substrate, such as the substrate 101 in FIGS. 1a–1e, during the actual cleaning process is maintained below the critical temperature $T_a$ although the surface temperature of the substrate during the degassing step reaches or even exceeds the desired temperature $T_o$ at which efficient out-gassing of the contaminants from the surface occurs.

Figure 4:
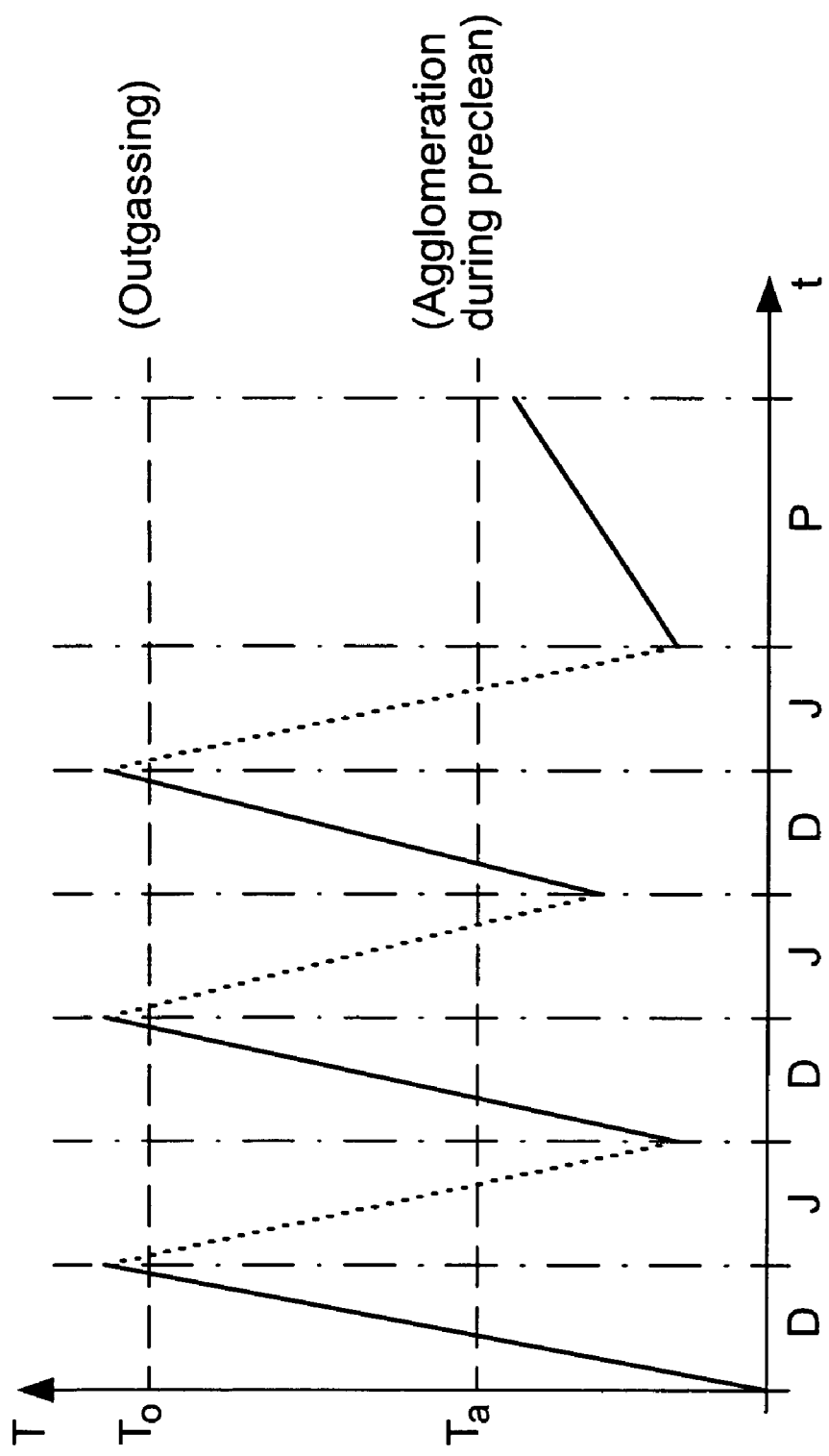
FIG. 4 schematically illustrates the surface temperature of the substrate versus the time of the process in a cleaning process according to a further embodiment of the present invention.

In one particular embodiment, one or more sequence interruptions are performed, for example similar to those shown in FIG. 4, to maintain the surface temperature of the substrate in the "vicinity" of the desired out-gassing temperature $T_o$, thereby increasing the overall efficiency of the degas process for a given desired out-gassing temperature. Thus, once suitable process parameters, such as length of the time period of the one or more sequence interruptions, are obtained by experiment, it is no longer necessary to monitor the surface temperature of the substrate, since the process parameters, such as the additional cooling effect obtained by the one or more sequence interruptions, are selected to tolerate slight process variations occurring during the process in the process line to still obtain a sufficiently low temperature after the last degas step for the subsequent clean step. That is, by combining a degas step and an interrupt step, i.e., a cool step, and performing a certain number of these cycles, a desired degree of out-gassing may be achieved without requiring extensive temperature monitoring of the substrate surface, which may be necessary when a single degas step is used to obtain the desired degree of out-gassing. After the desired degree of out-gassing, the surface temperature is well below the critical agglomeration temperature $T_a$.

According to a further illustrative embodiment, when several sequence interruptions are performed, the duration of each of the interruptions is from about 10 to about 40 seconds, and most preferably about 20 seconds.

In a further embodiment, the surface temperature of the substrate may be controlled by monitoring a temperature that is related to the surface temperature, such as the temperature of the bulk substrate or the temperature of the support stage that is in close contact with the substrate. Due to a temperature gradient from the surface of the substrate to the bulk material of the substrate, the temperature at the bottom of the substrate or at the surface of the support stage being in contact with the substrate might significantly differ from the surface temperature. Therefore, the temperatures at the bulk substrate and/or at the support stage and/or the cooling power supplied to the wafer, for example via the support stage, can be studied by experiment and may be correlated to the actual surface temperature, thereby taking into account such parameters as a type of support stage, atmosphere prevailing in the process chamber during the cleaning sequence, type of semiconductor wafer to be processed, (including wafer type, wafer diameter, "history" of wafer processing including type of integrated circuit, number of already existing metallization levels, and the like). In this way, the actual surface temperature may be indirectly monitored by determining the temperature of the bulk wafer and/or the cooling power applied to the support stage to keep the process temperature after the final cool step below the critical temperature $T_a$.

Figure 5:
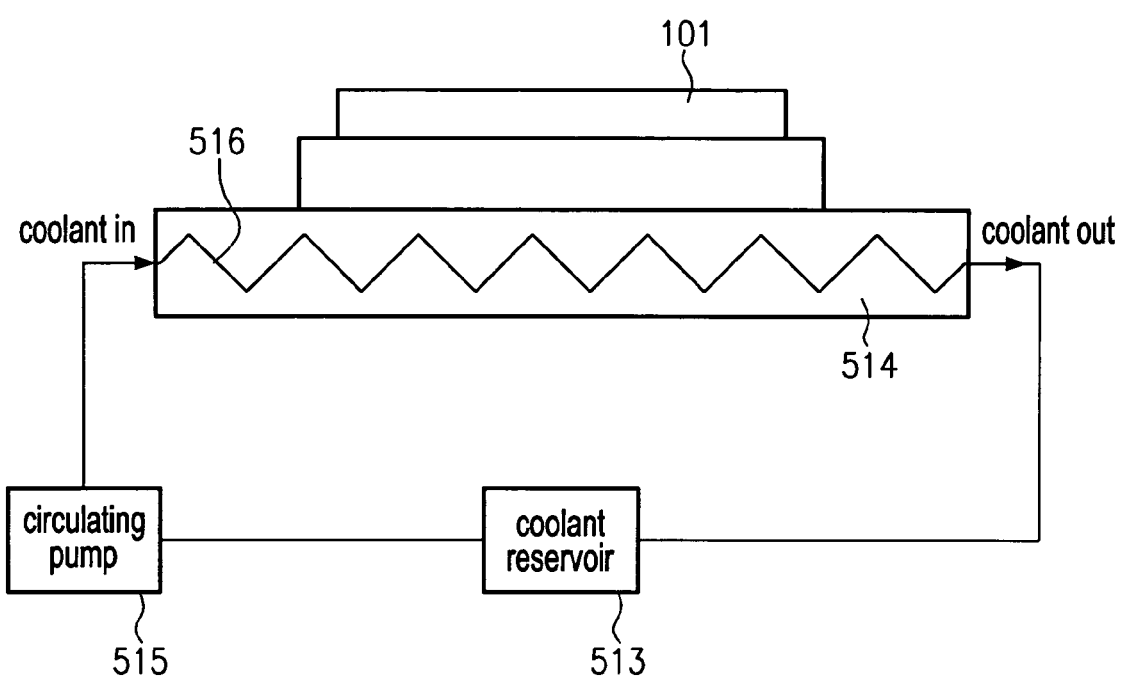
FIG. 5 schematically illustrates cooling the substrate by controlling the flow of a coolant to a support stage.

In an illustrative embodiment, the temperature of the bulk substrate is kept substantially constant at a value in the range of about 30 –80° C. during the entire cleaning step P to insure that the surface temperature will not exceed the critical temperature $T_a$, that is, a temperature gradient between the bulk substrate and the treated surface of the substrate is created to lower the surface temperature which would otherwise gradually rise. Prior to or at the beginning of the cleaning step P, the substrate temperature may rapidly be lowered from the out-gassing temperature $T_o$ to below the agglomeration temperature $T_a$ by correspondingly supplying cooling power to the wafer stage. As depicted in FIG. 5, the substrate 101 to be cleaned is supported by a support stage 514 comprising a cooling line 516, by circulating a coolant into the support stage 514 through a coolant reservoir 513 by means of a circulating pump 515, heat can be dissipated from the substrate 101 to the support stage 514 and the temperature of the substrate 101 can be kept lower than a predefined temperature. Moreover, the controlling of a temperature and/or cooling power may be combined with the performing of sequence interruptions as pointed out with reference to FIGS. 3 and 4. For instance, sequence interruption used for decreasing the surface temperature to an amount that is sufficient to stay well below the critical temperature $T_a$ after the completion of the cleaning process may effectively be assisted by increasing the cooling power, whereby the risk of unduly increasing the temperature gradient between the surface and the bottom of the substrate is reduced, since heat generation at the surface of the substrate is low during the sequence interruption.

Moreover, similar to the embodiment previously explained, a correlation between cooling power and void generation can be established by experiment, so that monitoring of the surface temperature or of a temperature related thereto during the actual manufacturing process is not necessary. The cooling power may be maintained at the sufficient high level during the entire process sequence, or may be increased only during sequence interruptions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of cleaning the surface of a substrate, said surface comprising a portion of a dielectric material and a portion of a conductive material, the method comprising:
   a first step of degassing the substrate to promote out-gassing of contaminants, wherein degassing the substrate further comprises:
      degassing the substrate over a plurality of degassing intervals; and
      interrupting the degassing between each degassing interval to allow cooling of the substrate;
   a second step of pre-cleaning the surface of the substrate by establishing at least one of an inert and a reactive ambient; and wherein a surface temperature of said substrate is kept below a predefined first temperature during said second step to inhibit agglomeration of the conductive material.

2. The method of claim 1, wherein said predefined first temperature is in the range of approximately 100° C. or less.

3. The method of claim 1, wherein an ambient on the basis of argon gas is established during said second step.

4. The method of claim 1, wherein the surface temperature of the substrate during said first step is kept below or equal to a second predefined temperature, higher than said first temperature, to promote out-gassing of contaminants.

5. The method of claim 3, wherein said surface temperature of the substrate prior to the pre-cleaning step is lowered below said first predefined temperature by means of a cooling step for cooling the substrate between the degassing intervals and after said degassing step prior to said pre-cleaning step.

6. The method of claim 5, wherein said cooling step comprises interrupting the cleaning process between the degassing intervals and after completion of the degassing step for a predefined time period and allowing the substrate to dissipate heat by at least one of thermal conduction, radiation and convection.

7. The method of claim 6, wherein said predefined time period ranges from approximately 10 seconds to 40 seconds.

8. The method of claim 7, wherein said predefined time period is about 20 seconds.

9. The method of claim 1, wherein said interruptions are in the range of about 20–40 seconds.

10. The method of claim 1, wherein said surface temperature of the substrate is adjusted by controlling the flow of a coolant to a support stage supporting the substrate.

11. The method of claim 1, wherein said surface temperature of the substrate is adjusted by maintaining a temperature of the bulk substrate within a range of approximately 30–80° C.

12. The method of claim 1, wherein said dielectric material is comprised of at least one of silicon dioxide, silicon nitride and a low-k dielectric.

13. The method of claim 12, wherein said conductive material is a metal.

14. The method of claim 13, wherein said metal is copper.

15. A method of forming vias in a dielectric layer formed over a metal line on a substrate, said method comprising:
 etching said vias in said dielectric layer according to a predefined layout to connect to said metal line;
 cleaning said substrate;
 wherein cleaning the substrate comprises:
  a first step of degassing the substrate to promote out-gassing of contaminants, wherein degassing the substrate further comprises:
   degassing the substrate over a plurality of degassing intervals; and
   interrupting the degassing between each degassing interval to allow cooling of the substrate;
  a second step of pre-cleaning the surface of the substrate by establishing at least one of a reactive and an inert plasma ambient, and
  wherein the surface temperature of said substrate is kept below a predefined first temperature $T_a$ during said second step to reduce agglomeration of the metal in said vias when etching said vias.

16. The method of claim 15, wherein said predefined first temperature $T_a$ is in the range of approximately 100° C. or less.

17. The method of claim 15, wherein the surface temperature of the substrate during said first step is kept below or equal to a second predefined temperature, higher than said first temperature, to promote out-gassing of contaminants.

18. The method of claim 15, wherein said first temperature is adjusted by maintaining a temperature of the bulk substrate in the range of approximately 30–80° C.

19. The method of claim 17, wherein the surface temperature of the substrate prior to the pre-cleaning step is lowered below said first predefined temperature $T_a$ by means of a cooling step for cooling the substrate after said degassing step and prior to said pre-cleaning step.

20. The method of claim 19, wherein said cooling step comprises interrupting the cleaning process after completion of the degassing step for a period of time and allowing the substrate to dissipate heat by at least one of thermal conduction, radiation and convection.

21. The method of claim 20, wherein said period of time ranges from approximately 10 second to 40 seconds.

22. The method of claim 21, wherein said period of time is about 20 seconds.

23. The method of claim 15, wherein said substrate is cooled by controlling the flow of a coolant to the support stage supporting the substrate.

24. The method of claim 15, wherein said dielectric material is silicon dioxide.

25. The method of claim 24, wherein said conductive material is a metal.

26. The method of claim 25, wherein said metal is copper.

27. A method of forming metal lines on the surface of a substrate, said method comprising:
 forming a dielectric layer on the surface of said substrate;
 forming an opening in said dielectric layer by etching;
 cleaning said substrate;
 wherein cleaning the substrate comprises:
  a first step of degassing the substrate to promote out-gassing of contaminants, wherein degassing the substrate further comprises:
   degassing the substrate over a plurality of degassing intervals; and
   interrupting the degassing between each degassing interval to allow cooling of the substrate;
  a second step of pre-cleaning the surface of the substrate by establishing a reaction plasma ambient;
  wherein the surface temperature of said substrate is kept below a predefined first temperature $T_a$ so that, when dielectric material is etched away in correspondence of a metal layer below the dielectric material to uncover a portion of said metal layer, agglomeration of the metal of the metal layer is substantially prevented;
 forming a barrier metal layer on said opening; and
 filing said opening with a conductive material.

28. The method of claim 27, wherein said conductive material is copper.

29. The method of claim 27, wherein said barrier layer is comprised of at least one of tantalum, tantalum nitride, titanium nitride and a combination thereof.

30. The method of claim 27, wherein the surface temperature of the substrate prior to the pre-cleaning step is lowered below said first predefined temperature $T_a$, so that, after completion of the cleaning process, a final surface temperature $T_f$ of the substrate does not exceed said first predefined temperature $T_a$.

31. The method of claim 30, wherein said surface temperature of the substrate prior to the pre-cleaning step is lowered below said first predefined temperature by means of a cooling step for cooling the substrate between the degassing intervals and after said degassing step and prior to said pre-cleaning step.

32. The method of claim 31, wherein said cooling step comprises interrupting the cleaning process between the degassing intervals and after completion of the degassing step for a period of time and allowing the substrate to dissipate heat by at least one of thermal conduction, radiation and convection for a predefined time period.

33. The method of claim 27, wherein the surface temperature of the substrate is maintained below said predefined first temperature $T_a$ by maintaining a temperature of the bulk substrate within a range of approximately 30–80° C.

34. The method of claim 27, wherein said predefined first temperature $T_a$ is approximately 100° C. or less.

* * * * *